United States Patent [19]

Pine et al.

[11] Patent Number: 5,164,022
[45] Date of Patent: Nov. 17, 1992

[54] METHOD AND APPARATUS FOR APPLYING SOLDER FLUX

[75] Inventors: Jerrold S. Pine, Boca Raton; Stefan Peana, Hollywood; Douglas W. Hendricks, Boca Raton, all of Fla.

[73] Assignee: Motorola, Inc., Schaumburg, Ill.

[21] Appl. No.: 656,385

[22] Filed: Feb. 19, 1991

[51] Int. Cl.⁵ .............................................. B23K 35/34
[52] U.S. Cl. ..................................................... 148/23
[58] Field of Search ........................................... 148/23

[56] References Cited

U.S. PATENT DOCUMENTS

| | | | |
|---|---|---|---|
| 3,023,301 | 2/1962 | Claussen | 148/23 |
| 3,243,569 | 3/1966 | Petry | 148/23 |
| 3,275,201 | 9/1966 | Tedeschi | 148/23 |
| 3,698,699 | 10/1972 | Bochinski | 148/23 |

*Primary Examiner*—Peter D. Rosenberg
*Attorney, Agent, or Firm*—Vincent B. Ingrassia; William E. Koch; Thomas G. Berry

[57] ABSTRACT

In an apparatus for depositing flux onto a solder work surface, a chamber having a plurality of openings therein is heated by means of a U-shaped current conducting heating element within which the flux chamber resides. This heating element heats the flux within the chamber until it vaporizes and is forced from the chamber through the openings onto the solder work surface.

9 Claims, 3 Drawing Sheets

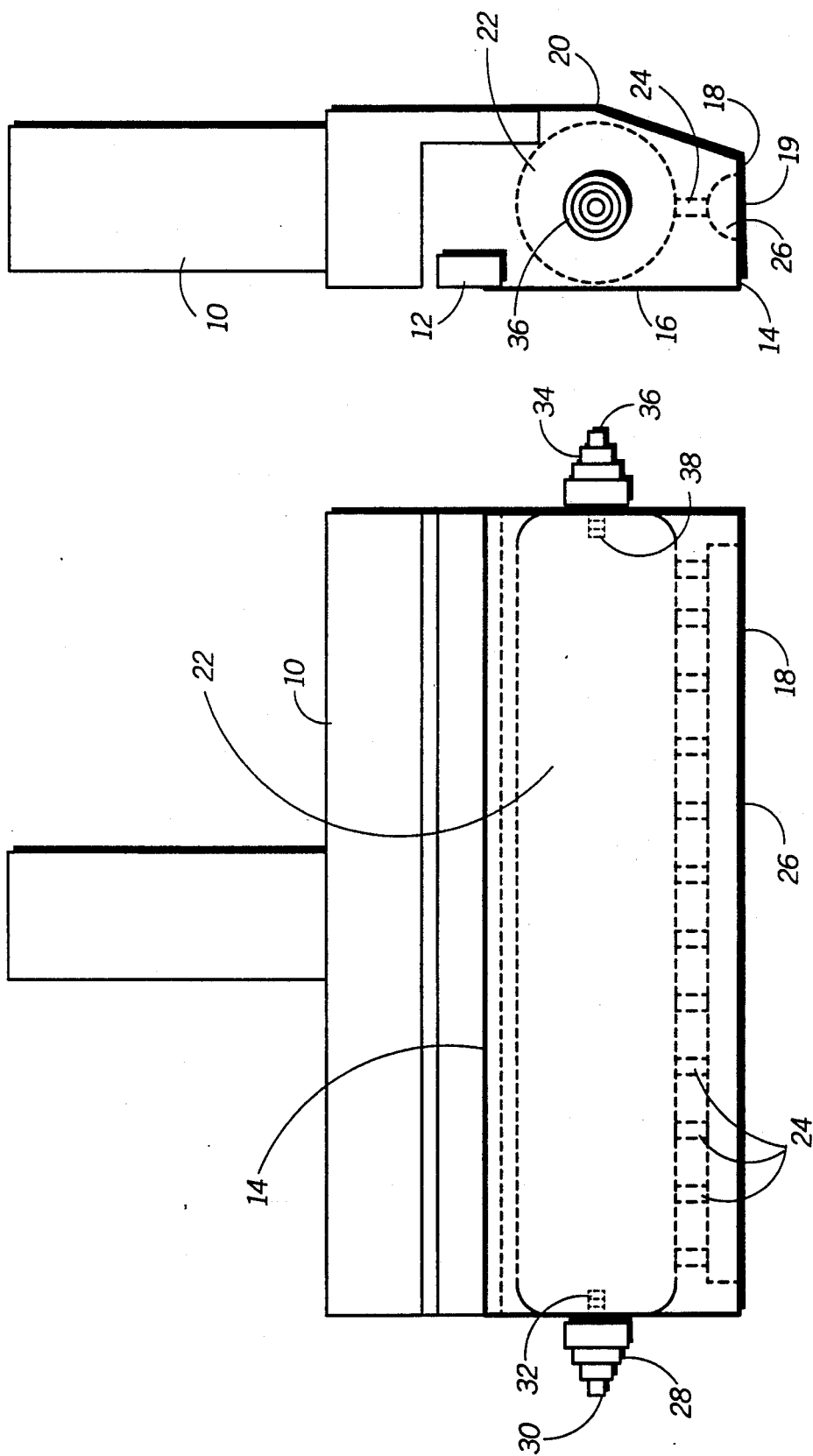

METHOD AND APPARATUS FOR APPLYING SOLDER FLUX

BACKGROUND OF THE INVENTION

This invention relates generally to a method and apparatus for applying solder flux onto a pretinned work surface, and more particularly, to a method and apparatus for applying a uniform film of flux to a solder work surface by dispensing flux into a perforated chamber surrounded by a thermode reflow device and heating the chamber until vaporized flux is forced onto the work surface.

There are several known techniques for applying flux in fine pitch thermal reflow processes. In some cases, a syringe containing the flux is attached to a manual or pneumatic dispenser. Unfortunately, such syringes are often difficult to handle and use, and the flux is not dispensed so as to produce a uniform film. Thus, not only does the volume of flux dispensed vary, but the wetting area also varies. In addition, the dispensing apparatus must be continually inspected to detect clogging.

In other cases, flux is brushed onto the solder work surface. In addition to suffering from some of the problems associated with syringes (i.e. volume and wetting area variation), flux being brushed can drip onto the work surface. Further, the brushes are easily contaminated.

Spraying is another technique for depositing flux on solder work surfaces. The spraying equipment itself, however, is very costly and requires a great deal of maintenance.

Thus, what is required is a reliable and inexpensive technique for applying flux onto a solder work surface.

SUMMARY OF THE INVENTION

According to a broad aspect of the invention, there is provided an apparatus for dispensing flux onto a surface comprising a chamber having at least one opening therein, the chamber for receiving a quantity of liquid flux, and first means for producing vaporized flux within the chamber which then exits through the opening onto the work surface.

The first means includes a current conducting heating element having a U-shaped cross section in which the chamber resides.

BRIEF DESCRIPTION OF THE DRAWINGS

FIGS. 1A and 1B are front and side views of the inventive flux dispensing apparatus.

DESCRIPTION OF THE PREFERRED EMBODIMENT

Figure 2A:
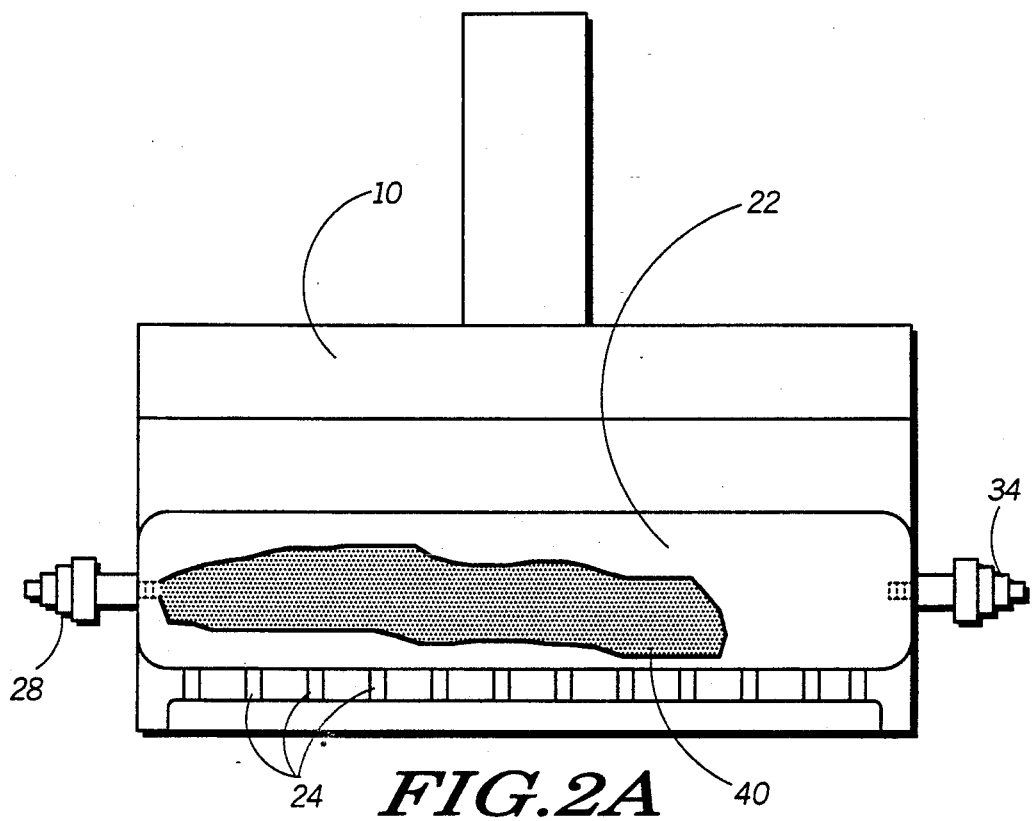
FIGS. 2A-D illustrate the steps taken by the apparatus shown in FIGS. 1A and 1B in carrying out the inventive flux dispensing technique.
Figure 2B:
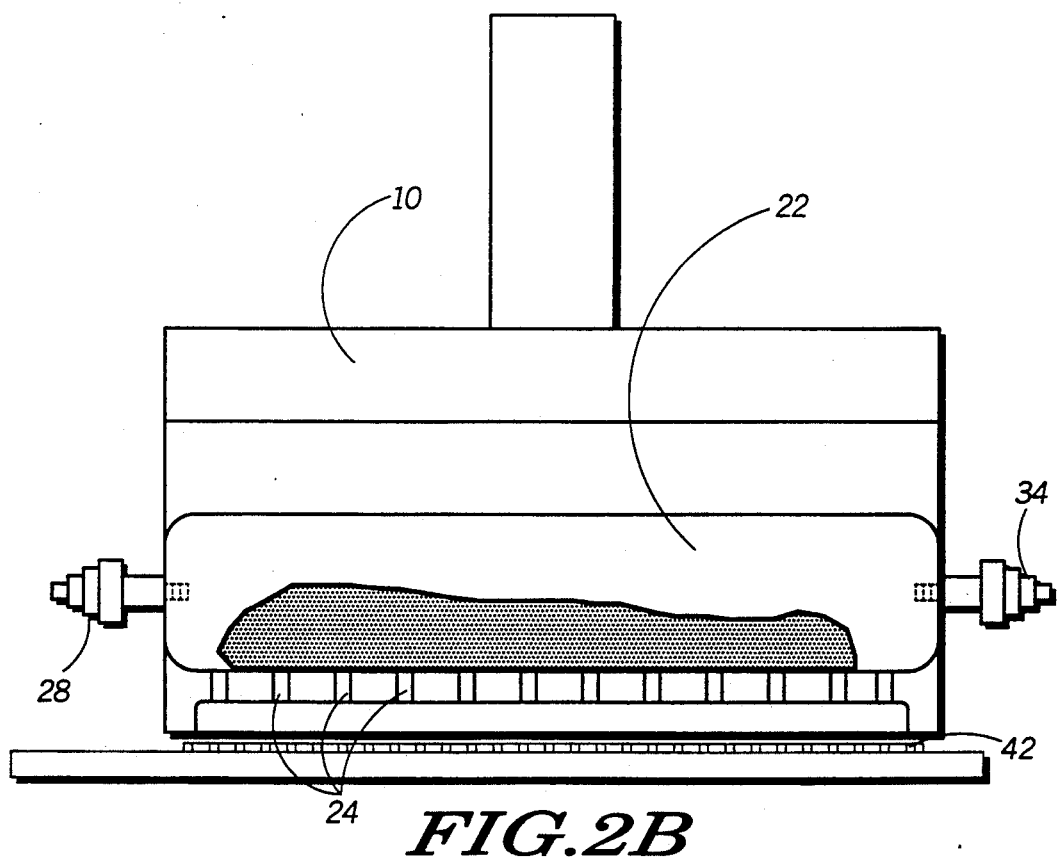

FIGS. 1A and 1B are front and side views, respectively, of the inventive flux dispensing apparatus. First and second electrodes 10 and 12 are coupled to a source of electrical energy (not shown). A folded, metallic, U-shaped current conducting heating element or thermode 14 is provided and includes a front surface 16, a base 18 having an opening 19 therein, and a rear surface 20. As can be seen, front surface 16 and rear surface 20 of thermode 14 are electrically coupled to electrodes 12 and 10, respectively. Thus, when an electrical potential different exists between electrodes 10 and 12, current will flow through thermode 14 causing it to be heated.

Positioned within folded thermode 14 and preferably in contact therewith is a flux heating chamber 22 as is shown in FIG. 1B. Heating chamber 22 is provided with a plurality of openings 24 through which vaporized flux may exit from flux chamber 22 into a flux deposition area or space 26.

Connected to one side of chamber 22 is a nozzle 28 having an inlet 30 which may be coupled to a source of flux (not shown) and an outlet 32 which extends into chamber 22. A second nozzle 34 has an inlet 36 coupled to a source of nitrogen/solvent (not shown) and has an outlet 38 which extends into chamber 22.

FIGS. 2A-2D illustrate the use of the apparatus shown in FIGS. 1A and 1B in carrying out the flux dispensing operation. For clarity, electrode 12 and front surface 16 of thermode 14 are not shown.

Referring to 2A, a fixed volume of low residue flux 40 (e.g. typically 0.5 cc's), for example, Multicore X32 manufactured and made commercially available by Multicore, is injected through nozzle 28 into chamber 22. Next, referring to FIG. 2B, the flux dispensing apparatus is positioned over a solder work surface 42. The solder work surface 42 may comprise a printed circuit board to which leaded components are to be attached. In such a case, the leads of the components are to be attached to pretinned runners on the printed circuit board. At this point, current begins to flow through the electrodes 10 and 12 and therefore through foldover thermode 14, thus heating the thermode.

Figure 2C:
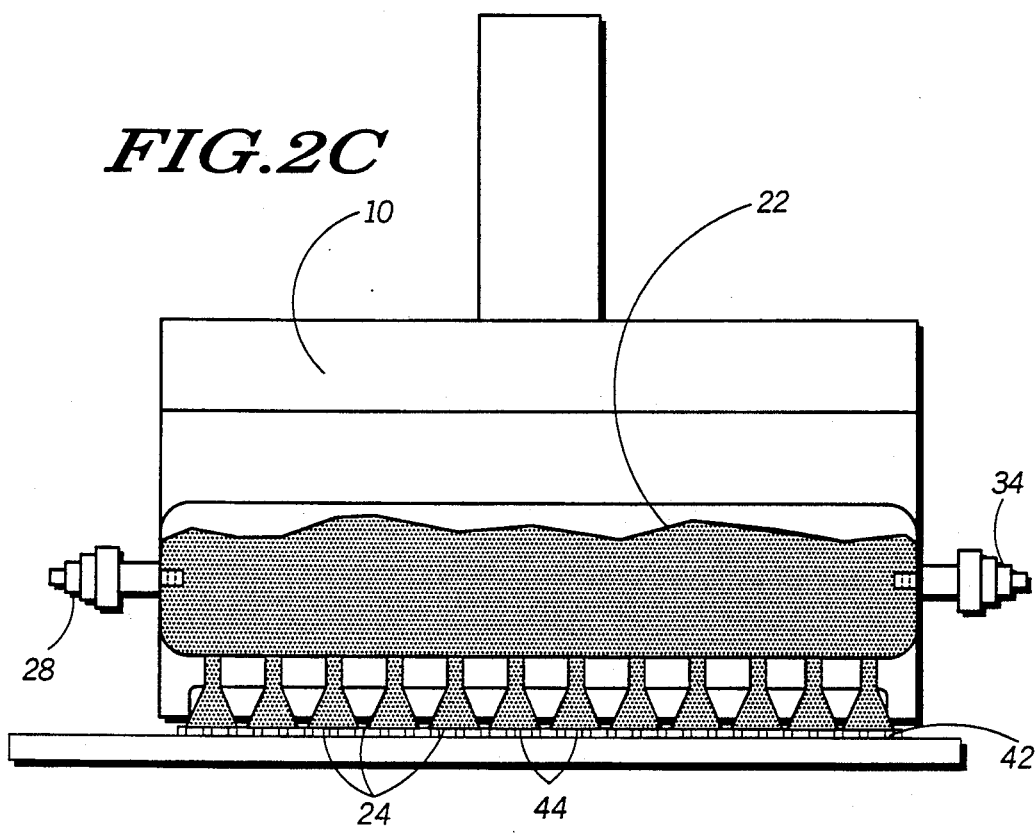

As the thermode heats above the flux activation temperature, the flux within chamber 22 vaporizes and is forced through holes 24 onto work surface 42 as is shown at 44 in FIG. 2C. Flux activation temperatures typically range from 120° C. to 160° C.

Figure 2D:
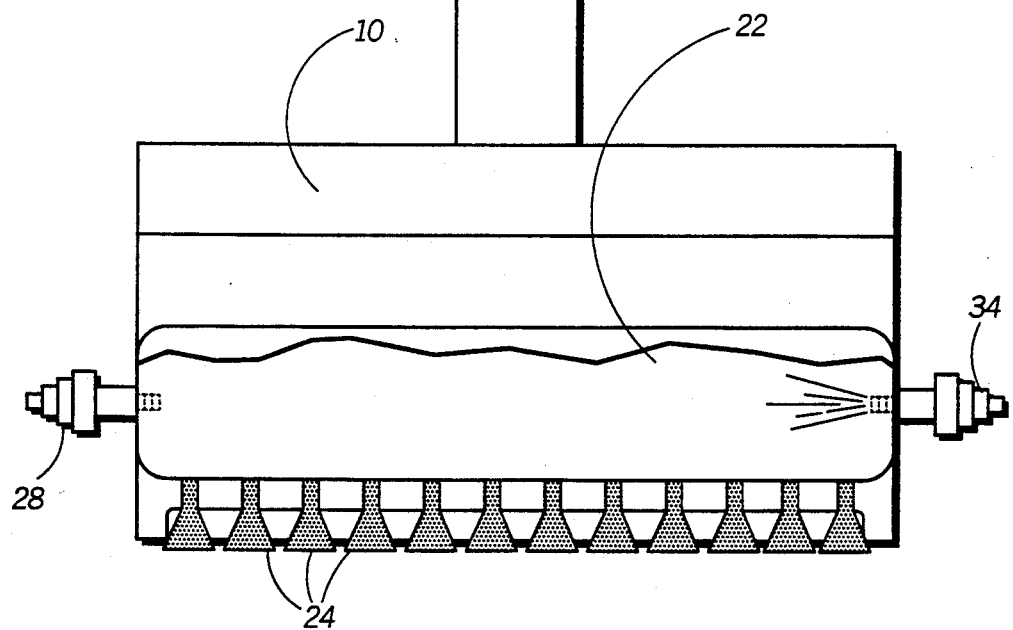

After a predetermined number of flux dispensing cycles have been accomplished, the apparatus may be moved over a flush tank where a solvent is forced through nozzle 34 into chamber 22 to clean and remove residue as is shown in FIG. 2D. The remaining solvent or residue in chamber 22 can then be forced out of openings 24 by injecting chamber 22 with nitrogen through nozzle 34.

It should be clear that in some cases, for example, when a leaded component is to be soldered to pretinned runners on a printed circuit board, the inventive apparatus can be used to dispense the required flux, and the heat of the thermode can be utilized to cause the required reflow. In other cases, for example the connection of a flexible connector to pretinned runners on the p.c. board, it would be necessary to position the flexible connector on the printed circuit board after flux has been dispensed and then perform the reflow step.

The inventive apparatus and method above described provides for the automatic dispensing of a uniform film of flux on a solder work surface. The flux dispensing components are automatically cleaned thus reducing the possibility of clogging. Furthermore, since the system is self-contained, the likelihood of contamination has been dramatically reduced.

What is claimed is:

1. An apparatus for depositing flux onto a surface, comprising:

a chamber having at least one opening therein, said chamber for receiving a quantity of liquid flux; and means for producing vaporized flux within said chamber which exits said opening onto said surface.

2. An apparatus according to claim 1 wherein said chamber includes a plurality of openings.

3. An apparatus according to claim 2 wherein said means for producing comprises a current conducting heating element proximate said chamber for heating the flux to its vaporization temperature.

4. An apparatus according to claim 3 wherein said heating element is folded to have a U-shaped cross section including front and rear surfaces and a base.

5. An apparatus according to claim 4 wherein said chamber resides substantially between said front and rear surfaces.

6. An apparatus according to claim 5 wherein said chamber is in contact with said front and rear surfaces.

7. An apparatus according to claim 6 wherein said chamber includes a first nozzle through which said flux enters said chamber.

8. An apparatus according to claim 7 wherein said chamber includes a second nozzle through which a cleaning substance enters said chamber.

9. An apparatus according to claim 4 wherein said base has an opening therethrough forming a flux deposition region.

* * * * *